(12) United States Patent
Margomenos (10) Patent No.: US 8,305,259 B2
(45) Date of Patent: Nov. 6, 2012

(54) DUAL-BAND ANTENNA ARRAY AND RF FRONT-END FOR MM-WAVE IMAGER AND RADAR

(75) Inventor: Alexandros Margomenos, Ann Arbor, MI (US)

(73) Assignee: Toyota Motor Engineering & Manufacturing North America, Inc., Erlanger, KY (US)

( * ) Notice: Subject to any disclaimer, the term of this patent is extended or adjusted under 35 U.S.C. 154(b) by 0 days.

(21) Appl. No.: 13/042,302

(22) Filed: Mar. 7, 2011

(65) Prior Publication Data
US 2011/0156946 A1 Jun. 30, 2011

Related U.S. Application Data

(63) Continuation of application No. 12/429,470, filed on Apr. 24, 2009, now Pat. No. 8,022,861, which is a continuation-in-part of application No. 12/340,448, filed on Dec. 19, 2008, now Pat. No. 7,830,301, and a continuation-in-part of application No. 12/098,283, filed on Apr. 4, 2008, now Pat. No. 7,733,265.

(51) Int. Cl.
*G01S 13/38* (2006.01)
*G01S 13/93* (2006.01)
*G01S 7/02* (2006.01)
*G01S 13/00* (2006.01)

(52) U.S. Cl. ............ 342/129; 342/27; 342/70; 342/118; 342/128; 342/175; 342/188; 342/195; 342/368; 343/700 R; 343/711; 343/872; 343/700 MS (58) Field of Classification Search .................... 342/27, 342/28, 59, 70–72, 175, 195, 52–55, 176, 342/179, 118, 128–133, 165, 173, 174, 361–377; 343/700 MS, 700 R, 703, 711–717, 793, 343/810, 812, 815, 817, 818, 833–840, 872, 343/873
See application file for complete search history.

(56) References Cited

U.S. PATENT DOCUMENTS

| | | | |
|---|---|---|---|
| 3,093,805 A | 6/1963 | Osifchin et al. | |
| 3,686,596 A | 8/1972 | Albee | |
| 4,259,743 A | * 3/1981 | Kaneko et al. | 342/175 |

(Continued)

FOREIGN PATENT DOCUMENTS

CN 101145627 3/2008
(Continued)

OTHER PUBLICATIONS

Pozar et al., "A Shared-Aperture Dual-Band Dual-Polarized Microstrip Array", *IEEE Transactions on Antennas and Propagation*, vol. 49, No. 2, pp. 150-157, Feb. 2001.

(Continued)

*Primary Examiner* — Bernarr Gregory
(74) *Attorney, Agent, or Firm* — Snell & Wilmer LLP (57) ABSTRACT

The radar includes a PCB having a top surface and a bottom surface, and a processor mounted on the bottom surface of the PCB. The radar includes a second liquid crystal polymer layer formed on the top surface of the printed circuit board, a second microstrip array printed on the second liquid crystal polymer layer, the second microstrip array having a patch, a first liquid crystal polymer layer formed on the second liquid crystal polymer layer, a first microstrip array printed on the first liquid crystal polymer layer, the first microstrip array having a perforated patch, an antenna positioned underneath the patch and connected to the second microstrip array, and a transmit/receive module connected to a bottom surface of the second liquid crystal polymer layer and configured to transmit a first frequency signal to the first microstrip array and a second frequency signal to the second microstrip array.

20 Claims, 8 Drawing Sheets

U.S. PATENT DOCUMENTS

| | | | | |
|---|---|---|---|---|
| 4,494,083 | A | 1/1985 | Josefsson et al. | |
| 4,513,266 | A | 4/1985 | Ishihara | |
| 4,623,894 | A | 11/1986 | Lee et al. | |
| 4,731,611 | A * | 3/1988 | Muller et al. | 342/28 |
| 4,786,913 | A | 11/1988 | Barendregt et al. | |
| 5,008,678 | A * | 4/1991 | Herman | 342/70 |
| 5,111,210 | A * | 5/1992 | Morse | 342/27 |
| 5,115,245 | A | 5/1992 | Wen et al. | |
| 5,124,713 | A | 6/1992 | Mayes et al. | |
| 5,153,600 | A | 10/1992 | Metzler et al. | |
| 5,220,335 | A | 6/1993 | Huang | |
| 5,262,783 | A * | 11/1993 | Philpott et al. | 342/28 |
| 5,307,075 | A | 4/1994 | Huynh | |
| 5,376,902 | A | 12/1994 | Bockelman et al. | |
| 5,436,453 | A | 7/1995 | Chang et al. | |
| 5,481,268 | A * | 1/1996 | Higgins | 342/70 |
| 5,485,167 | A | 1/1996 | Wong et al. | |
| 5,495,262 | A | 2/1996 | Klebe | |
| 5,512,901 | A | 4/1996 | Chen et al. | |
| 5,554,865 | A | 9/1996 | Larson | |
| 5,561,405 | A | 10/1996 | Hoffmeister et al. | |
| 5,583,511 | A | 12/1996 | Hulderman | |
| 5,633,615 | A | 5/1997 | Quan | |
| 5,724,042 | A * | 3/1998 | Komatsu et al. | 342/175 |
| 5,767,009 | A | 6/1998 | Yoshida et al. | |
| 5,815,112 | A | 9/1998 | Sasaki et al. | |
| 5,821,625 | A | 10/1998 | Yoshida et al. | |
| 5,867,120 | A * | 2/1999 | Ishikawa et al. | 342/175 |
| 5,877,726 | A | 3/1999 | Kudoh et al. | |
| 5,886,671 | A | 3/1999 | Riemer et al. | |
| 5,909,191 | A * | 6/1999 | Hirshfield et al. | 342/174 |
| 5,929,802 | A | 7/1999 | Russell et al. | |
| 5,933,109 | A * | 8/1999 | Tohya et al. | 342/175 |
| 5,943,005 | A | 8/1999 | Tanizaki et al. | |
| 5,952,971 | A | 9/1999 | Strickland | |
| 5,994,766 | A | 11/1999 | Shenoy et al. | |
| 5,999,092 | A | 12/1999 | Smith et al. | |
| 6,008,750 | A | 12/1999 | Cottle et al. | |
| 6,034,641 | A | 3/2000 | Kudoh et al. | |
| 6,037,911 | A | 3/2000 | Brankovic et al. | |
| 6,040,524 | A | 3/2000 | Kobayashi et al. | |
| 6,043,772 | A | 3/2000 | Voigtlaender et al. | |
| 6,091,365 | A | 7/2000 | Derneryd et al. | |
| 6,107,578 | A | 8/2000 | Hashim | |
| 6,107,956 | A | 8/2000 | Russell et al. | |
| 6,114,985 | A | 9/2000 | Russell et al. | |
| 6,130,640 | A | 10/2000 | Uematsu et al. | |
| 6,137,434 | A | 10/2000 | Tohya et al. | |
| 6,191,740 | B1 | 2/2001 | Kates et al. | |
| 6,232,849 | B1 | 5/2001 | Flynn et al. | |
| 6,249,242 | B1 | 6/2001 | Sekine et al. | |
| 6,278,400 | B1 | 8/2001 | Cassen et al. | |
| 6,281,843 | B1 | 8/2001 | Evtioushkine et al. | |
| 6,329,649 | B1 | 12/2001 | Jack et al. | |
| 6,359,588 | B1 | 3/2002 | Kuntzsch | |
| 6,388,206 | B2 | 5/2002 | Dove et al. | |
| 6,452,549 | B1 | 9/2002 | Lo | |
| 6,483,481 | B1 | 11/2002 | Sievenpiper et al. | |
| 6,483,714 | B1 | 11/2002 | Kabumoto et al. | |
| 6,501,415 | B1 | 12/2002 | Viana et al. | |
| 6,577,269 | B2 | 6/2003 | Woodington et al. | |
| 6,583,753 | B1 | 6/2003 | Reed | |
| 6,624,786 | B2 * | 9/2003 | Boyle | 343/700 MS |
| 6,628,230 | B2 | 9/2003 | Mikami et al. | |
| 6,639,558 | B2 | 10/2003 | Kellerman et al. | |
| 6,642,819 | B1 | 11/2003 | Jain et al. | |
| 6,642,908 | B2 | 11/2003 | Pleva et al. | |
| 6,657,518 | B1 | 12/2003 | Weller et al. | |
| 6,683,510 | B1 | 1/2004 | Padilla | |
| 6,686,867 | B1 | 2/2004 | Lissel et al. | |
| 6,703,965 | B1 * | 3/2004 | Ming et al. | 342/28 |
| 6,717,544 | B2 * | 4/2004 | Nagasaku et al. | 342/27 |
| 6,727,853 | B2 | 4/2004 | Sasada et al. | |
| 6,756,936 | B1 * | 6/2004 | Wu | 342/175 |
| 6,771,221 | B2 * | 8/2004 | Rawnick et al. | 343/700 MS |
| 6,784,828 | B2 | 8/2004 | Delcheccolo et al. | |
| 6,794,961 | B2 | 9/2004 | Nagaishi et al. | |
| 6,795,021 | B2 | 9/2004 | Ngai et al. | |
| 6,806,831 | B2 | 10/2004 | Johansson et al. | |
| 6,828,556 | B2 | 12/2004 | Pobanz et al. | |
| 6,833,806 | B2 * | 12/2004 | Nagasaku et al. | 342/27 |
| 6,842,140 | B2 | 1/2005 | Killen et al. | |
| 6,853,329 | B2 | 2/2005 | Shinoda et al. | |
| 6,864,831 | B2 | 3/2005 | Woodington et al. | |
| 6,873,250 | B2 | 3/2005 | Viana et al. | |
| 6,897,819 | B2 | 5/2005 | Henderson et al. | |
| 6,909,405 | B2 * | 6/2005 | Kondo | 342/70 |
| 6,930,639 | B2 | 8/2005 | Bauregger et al. | |
| 6,933,881 | B2 * | 8/2005 | Shinoda et al. | 342/70 |
| 6,940,547 | B1 | 9/2005 | Mine | |
| 6,946,995 | B2 | 9/2005 | Choi et al. | |
| 6,987,307 | B2 | 1/2006 | White et al. | |
| 6,992,629 | B2 | 1/2006 | Kerner et al. | |
| 7,009,551 | B1 | 3/2006 | Sapletal et al. | |
| 7,015,860 | B2 | 3/2006 | Alsliety | |
| 7,019,697 | B2 | 3/2006 | du Toit | |
| 7,030,712 | B2 | 4/2006 | Brunette et al. | |
| 7,034,753 | B1 | 4/2006 | Elsallal et al. | |
| 7,071,889 | B2 | 7/2006 | McKinzie, III et al. | |
| 7,081,847 | B2 | 7/2006 | Ziller et al. | |
| 7,098,842 | B2 | 8/2006 | Nakazawa et al. | |
| 7,102,571 | B2 | 9/2006 | McCarrick | |
| 7,106,264 | B2 | 9/2006 | Lee et al. | |
| 7,109,922 | B2 | 9/2006 | Shmuel | |
| 7,109,926 | B2 | 9/2006 | du Toit | |
| 7,154,356 | B2 | 12/2006 | Brunette et al. | |
| 7,154,432 | B2 * | 12/2006 | Nagasaku et al. | 342/27 |
| 7,170,361 | B1 | 1/2007 | Farnworth | |
| 7,177,549 | B2 | 2/2007 | Matsushima et al. | |
| 7,187,334 | B2 | 3/2007 | Franson et al. | |
| 7,193,562 | B2 | 3/2007 | Shtrom et al. | |
| 7,215,284 | B2 | 5/2007 | Collinson | |
| 7,236,130 | B2 | 6/2007 | Voigtlaender | |
| 7,239,779 | B2 | 7/2007 | Little | |
| 7,268,732 | B2 | 9/2007 | Gotzig et al. | |
| 7,292,125 | B2 | 11/2007 | Mansour et al. | |
| 7,298,234 | B2 | 11/2007 | Dutta | |
| 7,307,581 | B2 | 12/2007 | Sasada | |
| 7,310,061 | B2 * | 12/2007 | Nagasaku et al. | 342/195 |
| 7,331,723 | B2 | 2/2008 | Yoon et al. | |
| 7,336,221 | B2 | 2/2008 | Matsuo et al. | |
| 7,355,547 | B2 | 4/2008 | Nakazawa et al. | |
| 7,358,497 | B1 | 4/2008 | Boreman et al. | |
| 7,362,259 | B2 | 4/2008 | Gottwald | |
| 7,388,279 | B2 | 6/2008 | Fjelstad et al. | |
| 7,408,500 | B2 * | 8/2008 | Shinoda et al. | 342/70 |
| 7,411,542 | B2 | 8/2008 | O'Boyle | |
| 7,414,569 | B2 | 8/2008 | De Mersseman | |
| 7,436,363 | B1 | 10/2008 | Klein et al. | |
| 7,446,696 | B2 | 11/2008 | Kondo et al. | |
| 7,456,790 | B2 | 11/2008 | Isono et al. | |
| 7,463,122 | B2 | 12/2008 | Kushta et al. | |
| 7,489,280 | B2 | 2/2009 | Aminzadeh et al. | |
| 7,528,780 | B2 | 5/2009 | Thiam et al. | |
| 7,532,153 | B2 * | 5/2009 | Nagasaku et al. | 342/175 |
| 7,586,450 | B2 * | 9/2009 | Muller | 343/703 |
| 7,603,097 | B2 | 10/2009 | Leblanc et al. | |
| 7,639,173 | B1 * | 12/2009 | Wang et al. | 342/28 |
| 7,733,265 | B2 | 6/2010 | Margomenos et al. | |
| 7,830,301 | B2 | 11/2010 | Margomenos | |
| 7,881,689 | B2 * | 2/2011 | Leblanc et al. | 342/70 |
| 8,022,861 | B2 * | 9/2011 | Margomenos | 342/70 |
| 2002/0047802 | A1 | 4/2002 | Voipio | |
| 2002/0158305 | A1 | 10/2002 | Dalmia et al. | |
| 2003/0016162 | A1 | 1/2003 | Sasada et al. | |
| 2003/0034916 | A1 | 2/2003 | Kwon et al. | |
| 2003/0036349 | A1 | 2/2003 | Liu et al. | |
| 2004/0028888 | A1 | 2/2004 | Lee et al. | |
| 2004/0075604 | A1 | 4/2004 | Nakazawa et al. | |
| 2005/0109453 | A1 | 5/2005 | Jacobson et al. | |
| 2005/0156693 | A1 | 7/2005 | Dove et al. | |
| 2005/0248418 | A1 | 11/2005 | Govind et al. | |
| 2006/0044189 | A1 | 3/2006 | Livingston et al. | |
| 2006/0146484 | A1 | 7/2006 | Kim et al. | |
| 2006/0152406 | A1 | 7/2006 | Leblanc et al. | |
| 2006/0158378 | A1 | 7/2006 | Pons et al. | |

| | | | |
|---|---|---|---|
| 2006/0250298 A1 | 11/2006 | Nakazawa et al. | |
| 2006/0267830 A1 | 11/2006 | O'Boyle | |
| 2006/0290564 A1 | 12/2006 | Sasada et al. | |
| 2007/0026567 A1 | 2/2007 | Beer et al. | |
| 2007/0052503 A1 | 3/2007 | Quach et al. | |
| 2007/0085108 A1 | 4/2007 | White et al. | |
| 2007/0131452 A1 | 6/2007 | Gilliland | |
| 2007/0230149 A1 | 10/2007 | Bibee | |
| 2007/0279287 A1 | 12/2007 | Castaneda et al. | |
| 2007/0285314 A1 | 12/2007 | Mortazawi et al. | |
| 2008/0030416 A1 | 2/2008 | Lee et al. | |
| 2008/0048800 A1 | 2/2008 | Dutta | |
| 2008/0061900 A1 | 3/2008 | Park et al. | |
| 2008/0068270 A1 | 3/2008 | Thiam et al. | |
| 2008/0074338 A1 | 3/2008 | Vacanti | |
| 2008/0150821 A1 | 6/2008 | Koch et al. | |
| 2008/0169992 A1 | 7/2008 | Ortiz et al. | |
| 2009/0000804 A1 | 1/2009 | Kobayashi et al. | |
| 2009/0058731 A1 | 3/2009 | Geary et al. | |
| 2009/0066593 A1 | 3/2009 | Jared et al. | |
| 2009/0102723 A1 | 4/2009 | Mateychuk et al. | |
| 2009/0251357 A1 | 10/2009 | Margomenos | |
| 2009/0251362 A1 | 10/2009 | Margomenos et al. | |
| 2010/0182103 A1 | 7/2010 | Margomenos et al. | |
| 2010/0182107 A1 | 7/2010 | Margomenos | |

FOREIGN PATENT DOCUMENTS

| | | |
|---|---|---|
| EP | 1324423 | 7/2003 |
| JP | 4-40003 | 2/1992 |
| JP | 5-267931 | 10/1993 |
| JP | 6-224629 | 8/1994 |
| JP | 8-114667 | 5/1996 |
| JP | 8186437 | 7/1996 |
| JP | 11186837 | 7/1999 |
| JP | 2001-077608 | 3/2001 |
| JP | 2001-189623 | 7/2001 |
| JP | 2001-512640 | 8/2001 |
| JP | 2005-516446 | 6/2005 |
| WO | WO 2007/149746 | 12/2007 |
| WO | WO 2008148569 | 12/2008 |

OTHER PUBLICATIONS

Suntives et al.; "Design and Characterization of the EBG Waveguide-Based Interconnects", *IEEE Transactions on Advanced Packaging*, vol. 30, No. 2, pp. 163-170, May 2007.

Gedney et al., "Simulation and Performance of Passive Millimeter Wave Coplanar Waveguide Circuit Devices", *1997 Wireless Communications Conference*, pp. 27-31, May 1997.

Weller, Thomas M. "Three-Dimensional High-Frequency-Distribution Networks—Part I: Optimization of CPW Discontinuities", *IEEE Transactions on Microwave Theory and Techniques*, vol. 48, No. 10, pp. 1635-1642, Oct. 2000.

Omar et al., "Effects of Air-Bridges and Mitering on Coplanar Waveguide 90° Bends: Theory and Experiment", *1993 IEEE MTT-S Digest*, pp. 823-826, 1993.

Watson et al., "Design and Optimization of CPW Circuits Using EM-ANN Models for CPW Components"; *IEEE Transactions on Microwave Theory and Techniques*, vol. 45, No. 12, pp. 2515-2523, Dec. 1997.

Chouvaev et al., "Application of a Substrate-Lens Antenna Concept and SiGe Component Development for Cost-Efficient Automotive Radar", *Swedish National Testing and Research Institute, 34th European Microwave Conference*, Amsterdam, pp. 1417-1420, 2004.

Vetharatnam et al., "Combined Feed Network for a Shared-Aperture Dual-Band Dual-Polarized Array", *IEEE Antennas and Wireless Propagation Letters*, vol. 4., pp. 297-299, 2005.

Iizuka et al., "Millimeter-Wave Microstrip Array Antenna for Automotive Radars, IEICE Transactions for Communications", vol. E86-B, No. 9, pp. 2728-2738, Sep. 2003.

Leong et al., "Coupling Suppression in Microstrip Lines using a Bi-Periodically Perforated Ground Plane", *IEEE Microwave and Wireless Components Letters*, vol. 12, No. 5, pp. 169-171, May 2002.

U.S. Appl. No. 12/845,003, filed Jul. 28, 2010, Margomenos et al.

Schuler et al., Innovative Material Modulation for Multilayer LTCC Antenna at 76.5 GHz in Radar and Communication Applications; Proceedings of the 33rd European Microwave Conference, Munich Germany 2003; pp. 707-710; printed in the year 2003.

Ponchak et al., "Coupling in Between Microstrip Lines With Finite Width Ground Plane Embedded Thin-Film Circuits", *IEEE Transactions on Advanced Packaging*, vol. 28, No. 2, pp. 320-327, May 2005.

Ponchak et al., "The Use of Metal Filled Via Holes for Improving Isolation in LTCC RF and Wireless Multichip Packages", *IEEE Transactions on Advanced Packaging*, vol. 23, No. 1, pp. 88-99, Feb. 2000.

Papapolymerou et al., "Crosstalk Between Finite Ground Coplanar Waveguides Over Polyimide Layers for 3-D MMICs on Si Substrates", IEEE Transactions on Microwave Theory and Techniques, vol. 52, No. 4, pp. 1292-1301, Apr. 2004.

Margomenos et al., "Isolation in Three-Dimensional Integrated Circuits", *IEEE Transactions on Microwave Theory and Techniques*, vol. 51, issue 1, pp. 25-32, Jan. 2003.

Ponchak et al., "Characterization of the Coupling Between Adjacent Finite Ground Coplanar (FGC) waveguides", *Int. J. Microcircuits Electron. Packag.*, vol. 20, No. 4, pp. 587-592, Nov. 1997.

Mbairi et al., "On the Problem of Using Guard Traces for High Frequency Differential Lines Crosstalk Reduction", *IEEE Transactions on Components and Packaging Technologies*, vol. 30, No. 1, pp. 67-74, Mar. 2007.

* cited by examiner

DUAL-BAND ANTENNA ARRAY AND RF FRONT-END FOR MM-WAVE IMAGER AND RADAR

CLAIM OF PRIORITY UNDER 35 U.S.C. §120

The present application is a continuation application of co-pending U.S. patent application Ser. No. 12/429,470, entitled "Dual-Band Antenna Array and RF Front-End for Automotive Radars," filed on Apr. 24, 2009, now U.S. Pat. No. 8,022,861, which is a continuation-in-part application of U.S. patent application Ser. No. 12/340,448 now U.S. Pat. No. 7,830,301, entitled "Dual-Band Antenna Array and RF Front-End for Automotive Radars," filed on Dec. 19, 2008, and U.S. patent application Ser. No. 12/098,283 now U.S. Pat. No. 7,733,265, entitled "Three Dimensional Integrated Automotive Radars and Methods of Manufacturing the Same," filed on Apr. 4, 2008. The entire disclosures of each of these applications are assigned to the assignee hereof and hereby expressly incorporated by reference herein.

BACKGROUND

1. Field

The invention relates to three dimensional integrated automotive radars and passive mm-wave imagers. More particularly, the invention relates to a dual-band antenna array and RF front-end that can be used for creating a three dimensional integrated automotive radar and passive mm-wave imager.

2. Background

Automotive radar systems are currently being provided in many luxury automobiles. Over the past few years, automotive radar systems have been used with intelligent cruise control systems to sense and adjust the automobile's speed depending on traffic conditions. Today, automotive radar systems are being used with active safety systems to monitor the surroundings of an automobile for collision avoidance. Current automotive radar systems are divided into long range (for adaptive cruise control and collision warning) and short range (for pre-crash, collision mitigation, parking aid, blind spot detection, etc.). Two or more separate radar systems, for example, a 24 GHz short range radar system and a 77 GHz long range radar system, which are typically each 15×15×15 centimeters in dimensions, are used to provide long and short range detection. The long range radar systems are used to track vehicles in front of the automobile at long distances (e.g., 20 to 150 meters) and accordingly adjust the speed of the automobile.

Prior art automotive radar systems have several drawbacks. For example, since multiple prior art radar systems are separately mounted on a vehicle, significant space is needed and can be wasteful. The cost for packaging, assembling, and mounting each radar system increases due to the additional number of radar systems. In order for each radar system to work properly, the materials placed on top of each radar system needs to be carefully selected so that the materials are RF transparent. The cost for multiple radar systems is further increased because multiple areas of RF transparency are needed on the front, sides, and rear of the vehicle. Thus, increasing the number of radar systems increases the packaging, assembly, mounting, and materials costs.

Therefore, a need exists in the art for three dimensional integrated automotive radars having a dual-band antenna array and RF front-end for automotive radars and imagers.

SUMMARY

The invention relates to a dual-band antenna array and RF front-end that can be used for creating a three dimensional (3-D) integrated automotive radar and passive millimeter (mm)-wave imager. The 3-D integrated automotive radar can be used for both 77 GHz long range radar and mm-wave imaging applications. The 3-D integrated automotive radar significantly reduces manufacturing, assembling, and mounting costs. In addition, the 3-D integrated automotive radar is compact, thus reducing the space needed for mounting sensors on the vehicle (e.g., front and rear bumpers), wiring, and RF transparent materials in multiple locations on the front of the vehicle.

Millimeter wave imagers form an image based on receiving mm-wave radiation that is emitted from a scene. Millimeter wave imagers have the ability to sense objects through fog, dust, haze, sandstorms, etc. during both nighttime and daytime. Millimeter wave imagers advantageously do not radiate any signals thus making them very safe to operate and difficult to detect.

In one embodiment, the invention includes a method for creating a dual-band antenna array and RF front-end for automotive radars and imagers. The invention combines a 220 GHz mm-wave passive imager RF front-end with a 77 GHz radar antenna RF front-end on a single chip/system based on 3-D RF integration techniques. Combining the imager and the radar provides advantages in manufacturing, assembly, and testing costs. The combined imager and radar allow for a smaller size and for the packaging, assembly, and mounting to be together inside the vehicle (e.g., within the bumper). Also, data transfers between the imager and the radar can be accomplished more rapidly, efficiently, and with a reduced number of connections and wires. Data is used from both the imager and the radar to create an image of the environment.

In another embodiment, an automotive radar comprises a printed circuit board having a top surface, a bottom surface, and a cavity, a lower layer having a plurality of patches, the lower layer being positioned on the top surface of the printed circuit board, and a lower microstrip feed connected to the plurality of patches and positioned on the lower layer. The automotive radar also comprises an upper layer having a patch with a plurality of perforations that expose the plurality of patches, the upper layer being positioned on the lower layer, an upper microstrip feed connected to the patch and positioned on the upper layer, and a transmit module positioned in the cavity of the printed circuit board and configured to transmit a first signal having a first frequency to the upper microstrip feed and a second signal having a second frequency to the lower microstrip feed. The automotive radar also comprises an antenna positioned underneath the perforated patch or underneath the patch and connected to the first microstrip array or the second microstrip array.

BRIEF DESCRIPTION OF THE DRAWINGS

The features, objects, and advantages of the invention will become more apparent from the detailed description set forth below when taken in conjunction with the drawings, wherein.

DETAILED DESCRIPTION

Apparatus, systems and methods that implement the embodiments of the various features of the invention will now be described with reference to the drawings. The drawings and the associated descriptions are provided to illustrate some embodiments of the invention and not to limit the scope of the invention. Throughout the drawings, reference numbers are re-used to indicate correspondence between referenced elements. For purposes of this disclosure, the term "patch" may be used synonymously with the term "antenna."

Figure 1:
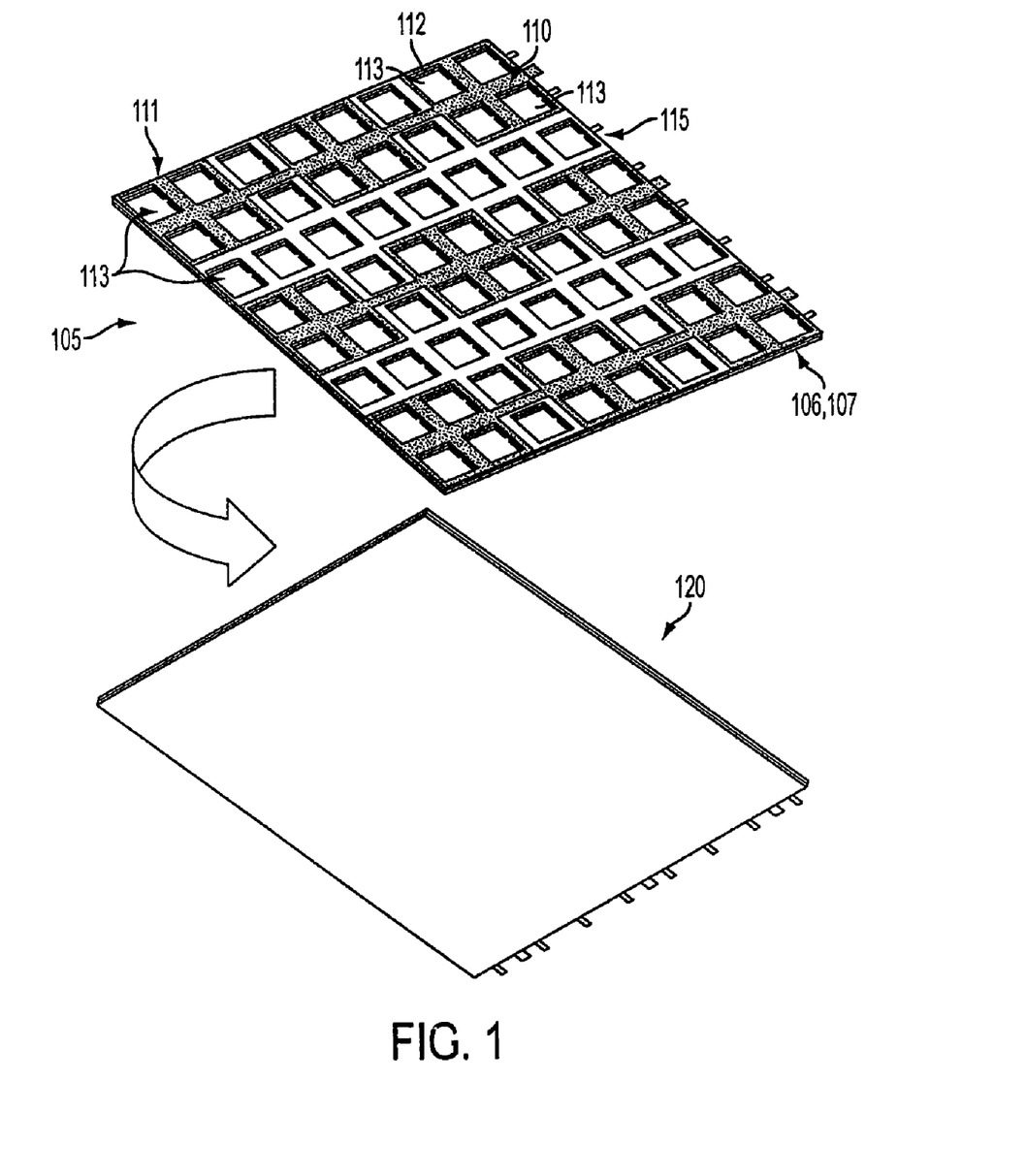
FIGS. 1, 2, and 3 are perspective, top, and exploded views, respectively, of a low-cost, compact radar and imager that utilizes a three-dimensional integrated architecture having a dual band array made of at least two bonded layers positioned on a common ground plane according to an embodiment of the invention.
Figure 2:
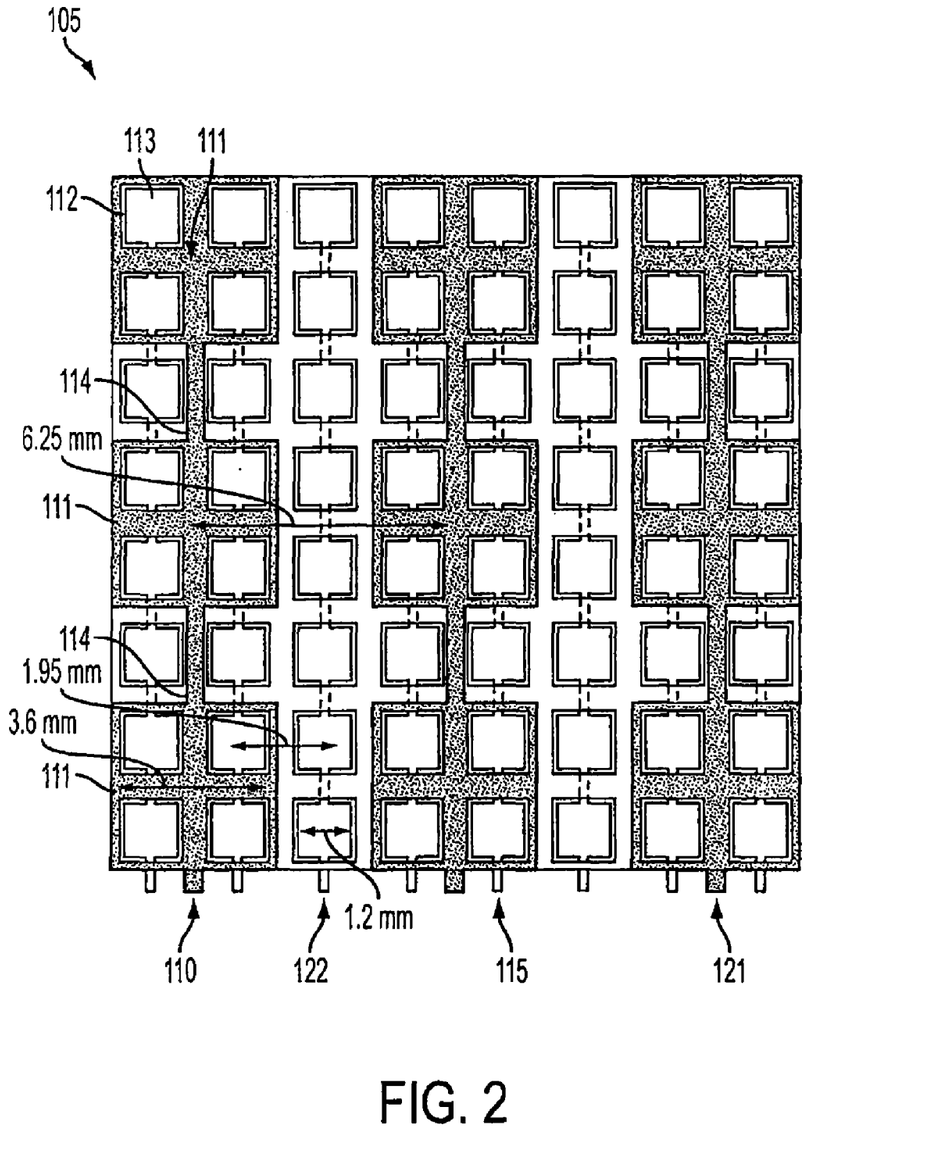
Figure 3:
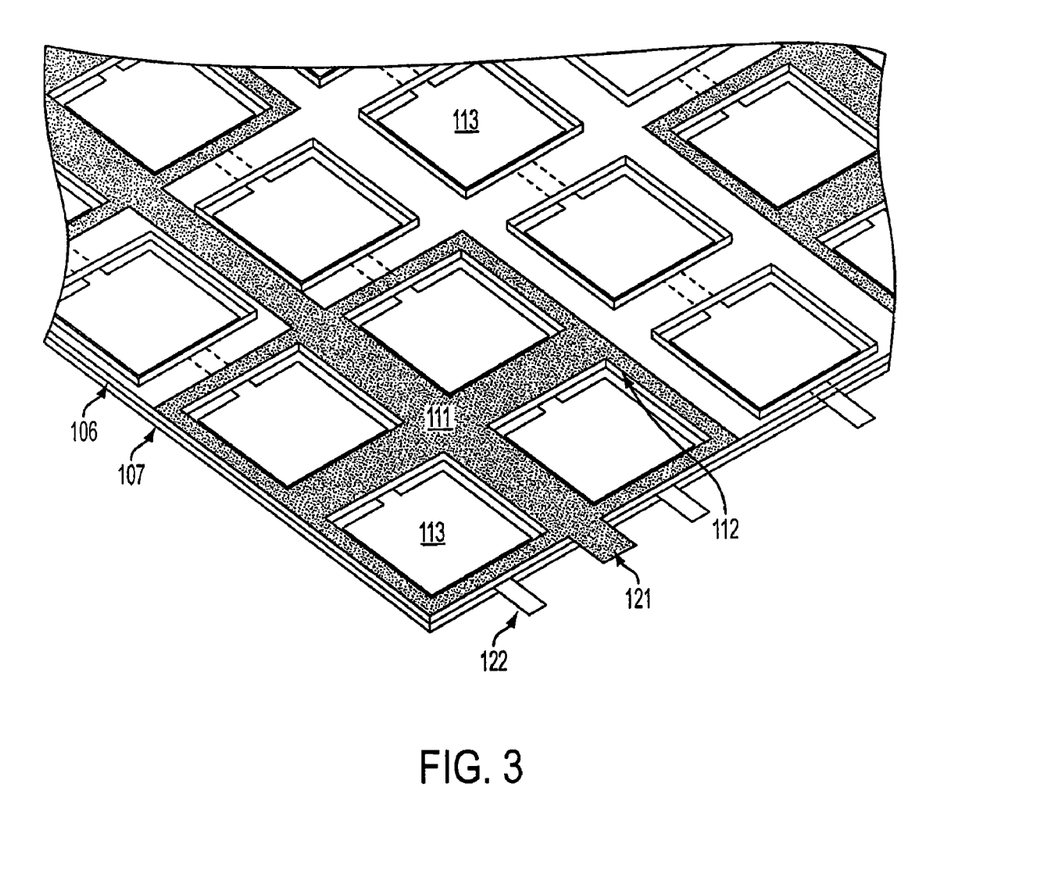

FIGS. 1, 2, and 3 are perspective, top, and exploded views, respectively, of a low-cost, compact radar and imager 100 that utilizes a three-dimensional integrated architecture having a dual band array 105 made of at least two bonded layers 106 and 107 positioned on a common ground plane 120 according to an embodiment of the invention. The radar and imager 100 includes a 77 GHz automotive radar and a 220 GHz passive mm-wave imager. The dual band array 105 includes a first layer 106 (e.g., a top or upper layer) and a second layer 107 (e.g., a lower layer). In one embodiment, the first layer 106 and the second layer 107 are bonded together, made of a low-cost mm-wave substrate and each approximately 4 mils thick. A number of different substrates can be used, each having their own fabrication tolerances and electrical and mechanical properties. The first layer 106 and the second layer 107 can be made of an Arlon CLTE-XT (PTFE ceramic), a Rogers RT 5880/RO 3003 (PTFE glass fiber), a Rogers Liquid Crystal Polymer (LCP), a low temperature cofired ceramic (LTCC), a Parylene N dielectric, a polytetrafluoroethylene (PTFE) ceramic, a PTFE glass fiber material, a Silicon material, a Gallium Arsenite (GaAs) material, an Alumina material, a PTFE material sold under the trademark TEFLON, a PTFE material sold under the trademark DUROID or any other material that can produce thin (about 2-4 mils in thickness) metallized layers which can be stacked to form multi-layer architectures. The radar and imager 100 may be implemented using hardware, software, firmware, middleware, microcode, or any combination thereof. One or more elements can be rearranged and/or combined, and other radars/imagers can be used in place of the radar and imager 100 while still maintaining the spirit and scope of the invention. Elements may be added to the radar and imager 100 and removed from the radar and imager 100 while still maintaining the spirit and scope of the invention.

The first layer (i.e., top layer) 106 has a series microstrip patch array 110 for 77 GHz operation. The patch array 110 includes one or more perforated patches 111 (i.e., antennas) where each hole or opening 112 is an approximately 1.4 millimeter square opening which uncovers a 220 GHz patch 113 (i.e., an antenna) located at or on the second layer (i.e., bottom layer) 107, which has a series microstrip patch array 115 for 220 GHz operation. The 220 GHz series microstrip patch array 115 may be printed on the second layer 107. In one embodiment, each perforated patch 111 is an approximately 3.6 millimeter square and each patch 113 is an approximately 1.2 millimeter square. The patches 111 are connected to one another via connectors 114. The size of each opening 112 is optimized to have minimum effects on the radiation performance of the patches 111 and 113. In one embodiment, the openings 112 on the first layer 106 allow unhindered radiation to be emitted from the 220 GHz patches 113. Furthermore, the openings 112 may be formed as a small horn-type of opening to further improve the radiation performance of the patches 111 and 113.

In order to ensure no grating lobes and low side lobe level, the spacing between the first patch array 110 and the second patch array 115 is $\lambda_0/2$, where $\lambda_0$ is the free space wavelength at 220 GHz and 77 GHz, respectively. Due to the ratio between the two frequencies (220/77≈3), two 220 GHz patches 113 are placed inside or within the outer boundaries of one 77 GHz patch 111. In addition, two 220 GHz patches 113 are placed between two adjacent 77 GHz patches 111.

Figure 4:
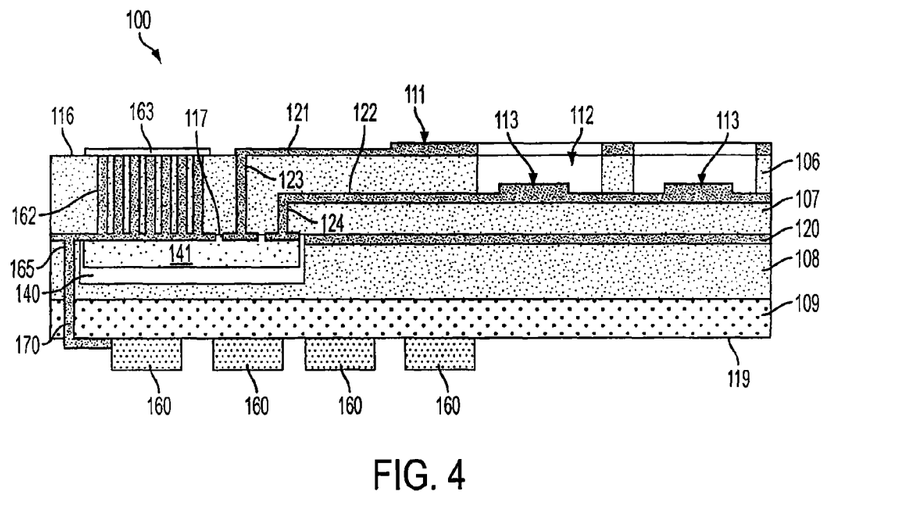
FIG. 4 is a cross-sectional view of a 3-D integrated dual-band RF front end of a radar and imager formed on a printed circuit board (PCB) according to an embodiment of the invention.

FIG. 4 is a cross-sectional view of a 3-D integrated dual-band RF front end of a radar and imager 100 formed on a printed circuit board (PCB) 109 according to an embodiment of the invention. In one embodiment, a packaging layer 108 is formed on the PCB 109. The packaging layer 108 is made of LCP and is used for packaging the T/R module 141. For example, the packaging layer 108 may have a cavity 140 for holding the T/R module 141. In addition, IF filters may be embedded in or fabricated on the packaging layer 108. In one embodiment, the T/R module 141 may be used for both or multiple frequencies.

The second layer 107 may be formed between the 220 GHz array 113 and the T/R module ground 120. The array of second patches 113 are formed on top of or are part of the second layer 107. The microstrip feed 122 connects the array of second patches 113 to the T/R module 141. The microstrip feed 122 is transitioned through a second via 124 to the T/R module 141. The first layer 106 may be formed on top of the microstrip feed 122 and/or the second layer 107. An array of first perforated patches 111 (e.g., 77 GHz patches) are formed on top of or are part of the first layer 106. The perforations 112 on the first layer 106 allow relatively unhindered radiation to pass from the array of second patches 113 (e.g., 220 GHz patches). In one embodiment, each perforation 112 is a horn-shaped opening (i.e., a lower portion of the horn is smaller in circumference than an upper portion of the horn), which improves the radiation performance of each patch 113. The microstrip feed 121 connects the array of first patches 111 to the T/R module 141. The microstrip feed 121 is transitioned through a first via 123 to the T/R module 141 and may be formed on or may be part of the first layer 106. The first layer 106 may contain the 77 GHz series patch array 110 and the microstrip feed 121. The microstrip feed 121 and the microstrip feed 122 may include a network of feed connectors or lines.

The first layer 106 has one or more microstrip feeds 121 and the second layer 107 has one or more microstrip feeds 122. The microstrip feeds 121 and 122 are used as connections to the first and second layers 106 and 107, respectively. In one embodiment, the patch arrays 110 and 115 are comprised of microstrip patch antennas.

A plurality of chips and/or components 160 (e.g., two Silicon-Germanium (SiGe) BiCMOS chips) may be mounted on a bottom surface 119 of the PCB 109. The plurality of chips and/or components 160 may include one or more of the following: a digital signal processor (DSP), a digital clock, a temperature controller, a memory, a microprocessor, dynamic link libraries, a DC port, a data port, a voltage controlled oscillator, a PLL, etc. The plurality of chips and/or components 160 may be connected to one another via wireless links or via connectors, traces or wires on the PCB 109. The output signals 170 (e.g., digital, DC, IF or RF signals) from the T/R module 141 may be directly connected using through-vias 165 (or may be wirelessly connected) to the plurality of chips and/or components 160.

The T/R module 141 may be flip-chip bonded or mounted on a bottom surface 117 of the second layer 107. The flip-chip transition provides significantly less parasitic inductance and lower loss compared to conventional wirebonds. A plurality of thermal vias 162 are directly connected to the T/R modules 141 and pass through the first and second layers 106 and 107. The plurality of thermal vias 162 are used to remove the heat from the T/R module 141 and transfer the heat to a heat rejection area 163 that is located on a top surface 116 of the first layer 106.

Figure 5:
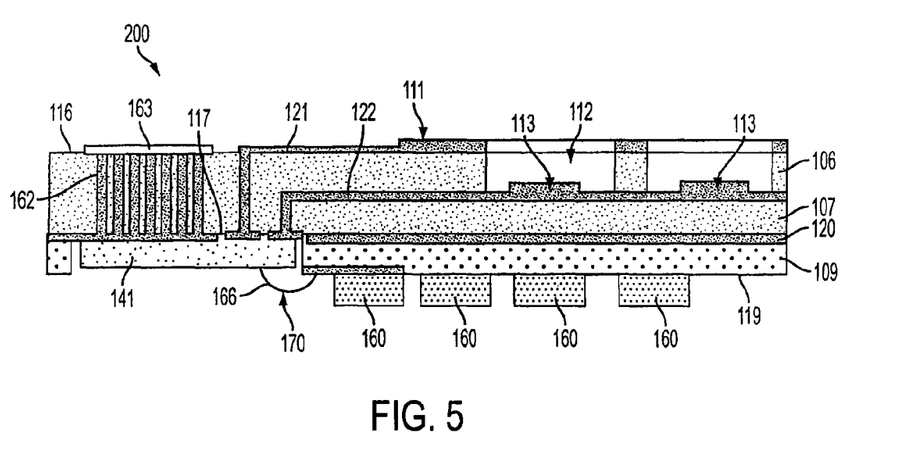
FIG. 5 is a cross-sectional view of a 3-D integrated dual-band RF front end of a radar and imager where the second layer is directly mounted to the PCB and a packaged T/R module is flip-chip mounted to a bottom surface of the second layer according to another embodiment of the invention.

FIG. 5 is a cross-sectional view of a 3-D integrated dual-band RF front end of a radar and imager 200 where the second layer 107 is directly mounted to the PCB 109 and a packaged T/R module 141 is flip-chip mounted to a bottom surface 117 of the second layer 107 according to another embodiment of the invention. The output signals 170 (e.g., digital, DC, IF or RF signals) from the packaged T/R module 141 may be directly connected using wirebonds 166 (or may be wirelessly connected) to the plurality of chips and/or components 160. In this embodiment, the T/R module 141 is pre-packaged so no additional LCP layer (such as 108 in FIG. 4) is needed.

Figure 6A:
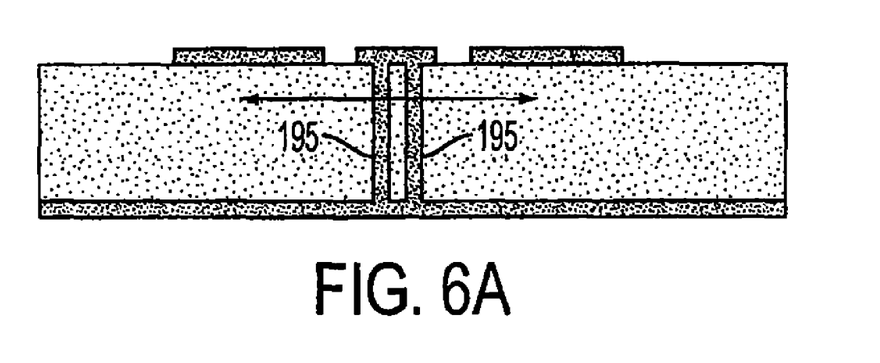
FIGS. 6A and 6B are cross-sectional and top views, respectively, of via fences that are used to provide isolation between the first patch array and the second patch array according to an embodiment of the invention.
Figure 6B:
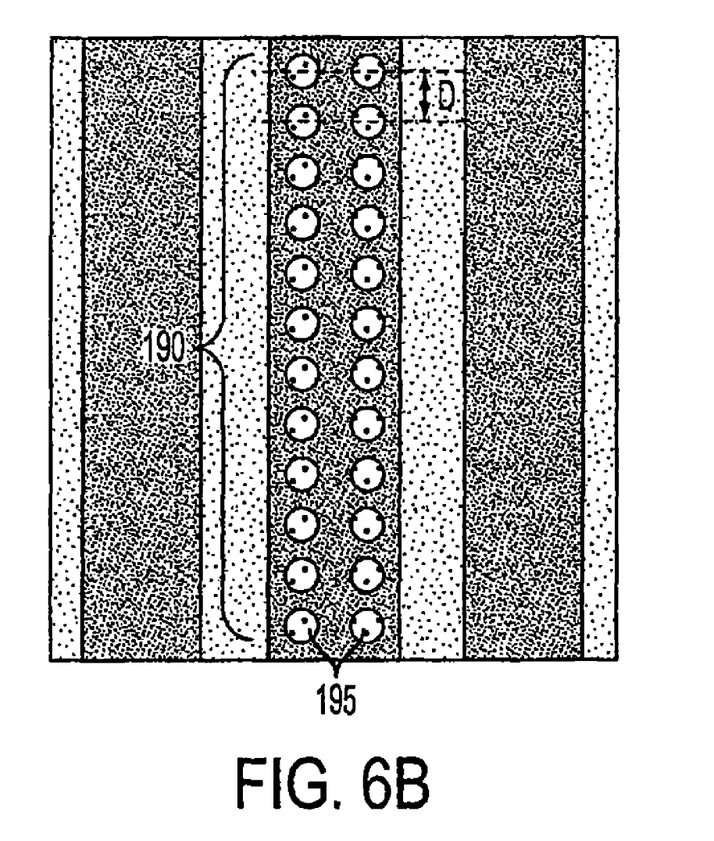

FIGS. 6A and 6B are cross-sectional and top views, respectively, of via fences 190 (i.e., a number of vias 195 positioned along a line) that are used to provide isolation between the first patch array 110 and the second patch array 115 according to an embodiment of the invention. The via fences 190 are used to ensure high isolation between the two frequencies. The vias 195 can also be spaced apart a distance D, where D can be varied in order to form bandgap filters. In addition to vias 195, periodic structures can be etched on the ground plane 120 in order to create bandgap effects. The result of these bandgap effects is that we can filter out the 77 GHz signals on the 220 GHz transmission line and vice versa.

Figure 7:
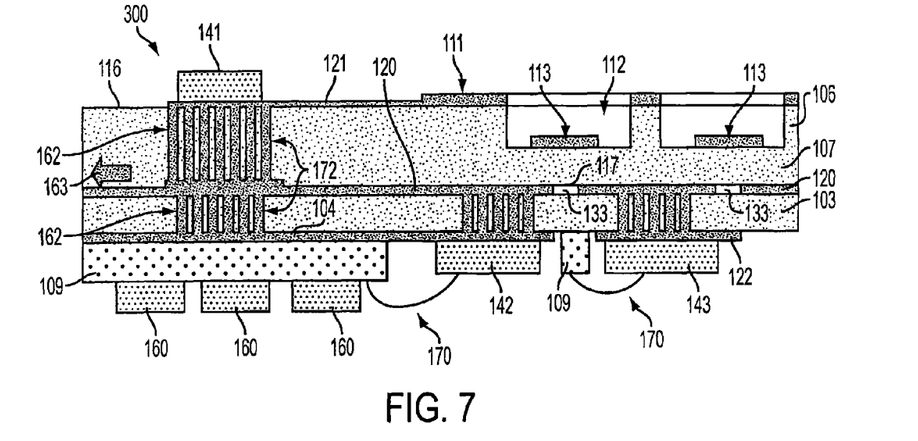
FIG. 7 is a cross-sectional view of a 3-D integrated dual-band RF front end of a radar and imager having a 220 GHz aperture feed array that is positioned under the 77 GHz patch array according to another embodiment of the invention.

FIG. 7 is a cross-sectional view of a 3-D integrated dual-band RF front end of a radar and imager 300 having a 220 GHz aperture feed array 113 that is positioned under the 77 GHz patch array 111 according to another embodiment of the invention. The 220 GHz array 113 is aperture fed. In particular, a plurality of apertures 133 are formed on the ground plane 120 and each aperture 133 is formed below or under a 220 GHz patch 113 and the 220 GHz microstrip line 122 is formed or printed on the backside of the third layer 103.

In one embodiment, the first layer 106 includes the array of 77 GHz perforated patches 111 along with the microstrip feeding network 121. The first layer 106 also includes a heat rejection area 163 for removing the heat generated at the SiGe or CMOS 77 GHz T/R module 141. The ground plane 120 is formed or positioned on or adjacent to a third layer 103. The third layer 103 may be similar to the first and second layers 106 and 107. Therefore, the ground plane 120 separates the 77 GHz patch array 111 and the chips 160 from the 220 GHz components (e.g., 220 GHz receiver modules 142 and 143), thus minimizing or reducing the crosstalk between the 77 GHz lines or systems and the 220 GHz lines or systems. The plurality of chips and/or components 160 are connected or mounted to the PCB 109. Typically, one 220 GHz receiver module (e.g., SiGe, InP, GaAs or CMOS chip) is positioned behind each pixel, therefore there is no distribution network for the 220 GHz focal plane array 810.

The microstrip feed 121 is used to connect the first layer 106 to a first (e.g., 77 GHz) transmit/receive (T/R) module 141 and the microstrip feed 122 is used to connect the second layer 107 to a second (e.g., 220 GHz) T/R module 142. The first T/R module 141 may be formed or positioned on a top surface 116 of the first layer 106 and connected to the first microstrip feed 121. The second T/R module 142 may be formed or positioned on a bottom surface 104 of the third layer 103 and connected to the second microstrip feed 122. The first T/R module 141 is connected to the plurality of chips and/or components 160 using vias 172 and the first and second receive modules 142 and 143 are connected to the plurality of chips and/or components 160 using wired or wireless signals 170.

Packaged module 141 for 77 GHz operation is mounted on the top surface 116 of the first layer 106 and packaged modules 142 and 143 for 220 GHz operation is mounted on the third layer 103. The first and second T/R modules 141 and 142 may be a T/R monolithic microwave integrated circuit (MMIC) or a Silicon-Germanium (SiGe) BiCMOS chip that may include one or more of the following: a T/R switch, a low noise amplifier (LNA), a variable gain amplifier (VGA), a power amplifier (PA), a phase shifter, a mixer, an intermediate frequency (IF) amplifier, and an analog-to-digital (A/D) converter. The first T/R module 141 may generate first frequency signals (e.g., 77 GHz signals) and the first and second modules 142 and 143 may receive second frequency signals (e.g., 220 GHz signals).

The three mm-wave substrate layers 106, 107 and 103 are mounted on the PCB 109 such that the third layer 103 is directly mounted on the PCB 109. The PCB hosts all the digital circuitry. The interconnections between the T/R module 141 and the PCB 109 are achieved through vias 162 (for the 77 GHz module) and between the receive modules 142 and 143 and the PCB 109 are achieved through wirebonds 170 (for the 220 GHz modules). In both cases, the interconnections are at a very low Intermediate Frequency or DC. Therefore, limited parasitic effects exist from the interconnections to the PCB 109. The heat rejection area 163 is on the side of the array and appropriate thermal straps are used to remove heat from under the T/R module 141 and the receive modules 142 and 143.

Figure 8:
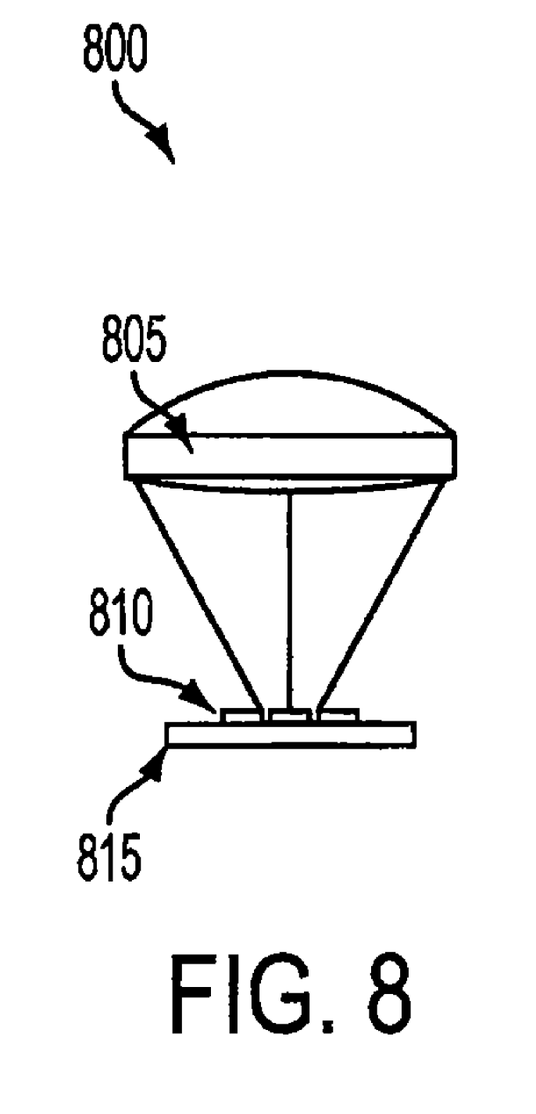
FIG. 8 is a block diagram of a passive mm-wave imager according to an embodiment of the invention.

FIG. 8 is a block diagram of a passive mm-wave imager 800 according to an embodiment of the invention. The mm-wave imager 800 includes a lens 805 that focuses a plurality of received mm-wave rays at a specific focal plane. On the specific focal plane, a focal plane array (FPA) of a plurality of sensitive receivers detects the plurality of received mm-wave rays and reconstructs the signal using read out integrated circuits. The 77 GHz radar does not require a lens for its operation. In one embodiment, a lens may be used only for beam correction and side lobe level reduction, however, the lens is not necessary. The radar and imager 300 can utilize a lens positioned over the patches 111 and 113 that is completely transparent at 77 GHz and operates at 220 GHz. Alternatively, the radar and imager 300 can utilize a lens positioned over the patches 111 and 113 that operates at both 77 GHz and 220 GHz.

Figure 9:
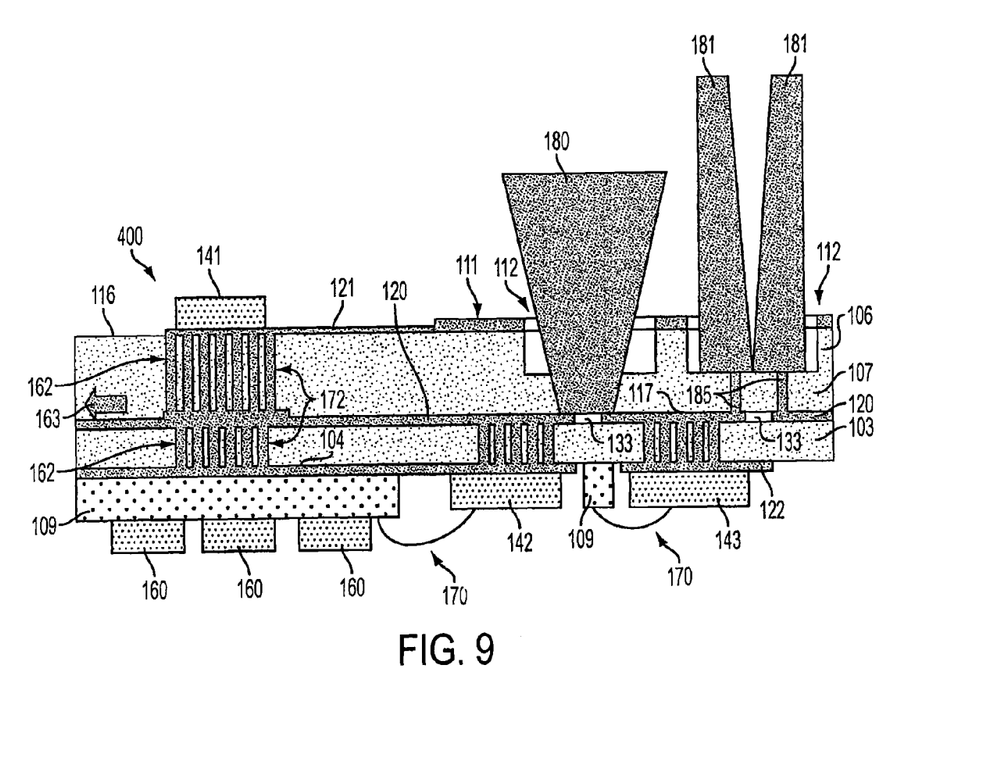
FIG. 9 is a cross-sectional view of a 3-D integrated dual-band RF front end of a radar and imager having different 220 GHz antennas according to another embodiment of the invention.

FIG. 9 is a cross-sectional view of a 3-D integrated dual-band RF front end of a radar and imager 400 having different 220 GHz antennas according to another embodiment of the invention. For example, for the 220 GHz antennas a microstrip patch antenna may be used. Another example is to use the perforations at the 77 GHz patches and form a 220 GHz horn antenna 180. Another example is to fabricate endfire antenna 181 for 220 GHz operation. The endfire antenna 181 can be attached vertically inside the hole 112 of the 77 GHz perforated patches 111. The endfire antenna 181 can be Yagi-Uda or any form of a tapered slot antenna (e.g., Vivaldi, Fermi, etc.). As an example, FIG. 9 shows one 220 GHz horn antenna 180 and one 220 GHz tapered slot antenna 181. A waveguide-to-microstrip transition is used to feed the 220 GHz horn antenna 180. A coplanar waveguide to coplanar strip transition is used to feed the 220 GHz tapered slot antenna 181.

A low cost substrate (such as LCP) is used to reduce the costs associated with printing the antennas, mounting the SiGe, InP, GaAs or CMOS chips, creating thermal management systems, packaging the chips. Hence, the overall cost of the radars and imagers disclosed herein is significantly reduced. The 3-D integration techniques also improve the performance of the radar and imager since they significantly reduce the number of necessary RF transitions from the antennas to the low noise amplifiers on the receiver chips and also improves the insertion loss. This reduces the overall system noise and improves the radar and imager sensitivity (i.e., range and minimum detectable target radar cross section). By combining the 220 GHz imager and the 77 GHz radar, the space on the vehicle needed to install mm-wave sensors is reduced, since only one mounting bracket can be used for both systems. Furthermore, the costs for packaging, assembly, and mounting of the mm-wave sensors are reduced. Also, by combining the 220 GHz imager and the 77 GHz radar, the need for wiring for data fusion between sensors and the use of mm-wave transparent materials is reduced.

Those of ordinary skill would appreciate that the various illustrative logical blocks, modules, and algorithm steps described in connection with the examples disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the disclosed apparatus and methods.

The various illustrative logical blocks, modules, and circuits described in connection with the examples disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the examples disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an Application Specific Integrated Circuit (ASIC). The ASIC may reside in a wireless modem. In the alternative, the processor and the storage medium may reside as discrete components in the wireless modem.

The previous description of the disclosed examples is provided to enable any person of ordinary skill in the art to make or use the disclosed methods and apparatus. Various modifications to these examples will be readily apparent to those skilled in the art, and the principles defined herein may be applied to other examples without departing from the spirit or scope of the disclosed method and apparatus. The described embodiments are to be considered in all respects only as illustrative and not restrictive and the scope of the invention is, therefore, indicated by the appended claims rather than by the foregoing description. All changes which come within the meaning and range of equivalency of the claims are to be embraced within their scope.

What is claimed is:

1. A dual-band radar, comprising:
a first planar antenna configured to transmit or receive at a first frequency, the first planar antenna having a plurality of first patches, each of the plurality of first patches defining a plurality of perforations;
a second planar antenna configured to transmit or receive at a second frequency, the second planar antenna spatially overlapping with the first planar antenna and having a plurality of second patches, each of the plurality of second patches aligning with one of the plurality of perforations of the first planar antenna; and
a transceiver coupled to the first planar antenna and the second planar antenna, the transceiver is configured to generate or receive signals having the first frequency or the second frequency.

2. The dual-band radar of claim 1, further comprising:
a first layer having a first surface and a second surface opposing the first surface, the first surface contacting the first planar antenna and defining a plurality of openings, each of the plurality of openings aligning with one of the plurality of perforations of the first planar antenna.

3. The dual-band radar of claim 2, wherein each of the plurality of openings has a first size along the first surface of the first layer and a second size along the second surface of the first layer, and the first size is greater than the second size.

4. The dual-band radar of claim 2, further comprising:
a second layer having a first surface and a second surface opposing the first surface, the first surface contacting the second planar antenna and a portion of the second surface of the first layer.

5. The dual-band radar of claim 4, wherein the first layer and the second layer are each made of a material selected from a group consisting of a liquid crystal polymer, a polytetrafluoroethylene (PTFE) ceramic, a PTFE glass fiber material, a Parylene N dielectric material, a low temperature cofired ceramic, a silicon material, a gallium arsenite material, an alumina material, and combinations thereof.

6. The dual-band radar of claim 4, further comprising:
a ground plane contacting the second surface of the second layer, and configured to connect the transceiver to a ground source.

7. The dual-band radar of claim 6, further comprising:
a package layer contacting the ground plane, the package layer defining a cavity for housing the transceiver.

8. The dual-band radar of claim 4, further comprising:
a printed circuit board spatially overlapping with the second layer, the circuit board having a signal processing device in communication with the transceiver.

9. The dual-band radar of claim 4, further comprising:
a heat rejection area formed on the first surface of the first layer; and
a plurality of thermal vias penetrating the first layer and the second layer, and configured to conduct heat energy from the transceiver to the heat rejection area.

10. The dual-band radar of claim 1, wherein the second frequency is approximately three times of the first frequency.

11. The dual-band radar of claim 1, wherein:
each of the plurality of first patches has a first surface area,
each of the plurality of second patches has a second surface area, and
the first surface area is approximately four times of the second surface area.

12. The dual-band radar of claim 1, further comprising:
a lens positioned to focus a plurality of millimeter waves at a focal plane aligning with the plurality of second patches of the second planar antenna.

13. A radar for use in a motor vehicle, comprising:
a first substrate layer defining a plurality of perforations;
a first patch array printed on the first substrate layer, and configured to transmit or receive at a first frequency, the first patch array having a plurality of first patches, each of the plurality of first patches defining a plurality of openings, each of the plurality of openings aligning with one of the plurality of perforations of the first substrate layer;
a second substrate layer contacting the first substrate layer and opposing the first patch array;
a second patch array printed on the second substrate layer and partially blocking the plurality of perforations of the first substrate layer, the second patch array configured to transmit or receive at a second frequency, and having a plurality of second patches, each aligning with one of the plurality of openings of the first patch array; and
a transceiver positioned adjacent to the second substrate layer and opposing the first substrate layer, the transceiver coupled to the first patch array and the second patch array, and configured to generate or receive signals having the first frequency or the second frequency.

14. The radar of claim 13, wherein the second frequency is approximately three times of the first frequency.

15. The radar of claim 13, wherein:
each of the plurality of first patches has a first surface area,
each of the plurality of second patches has a second surface area, and
the first surface area is approximately four times of the second surface area.

16. The radar of claim 13, further comprising:
a lens arranged to redirect a plurality of millimeter waves to a focal plane overlapping with the plurality of second patches of the second patch array.

17. The radar of claim 13, further comprising:
a heat rejection area formed on the first substrate layer and opposing the second substrate layer; and
a plurality of thermal vias positioned within the first substrate layer and the second substrate layer, and configured to conduct heat energy from the transceiver to the heat rejection area.

18. A dual-band radar, comprising:
a first patch array positioned along a first plane, and configured to transmit or receive at a first frequency, the first patch array having a plurality of first patches, each of the plurality of first patches defining a plurality of perforations;
a second patch array positioned along a second plane, and having a plurality of second patches, each aligning with one of the plurality of perforations of the first patch array;
a ground plate positioned along a third plane, and defining a plurality of apertures, each of the plurality of apertures cooperating with one of the plurality of second patches to transmit or receive at a second frequency; and
a transceiver in communication with the first patch array and the second patch array, and configured to generate or receive signals having the first frequency or the second frequency.

19. The dual-band radar of claim 18, further comprising:
a lens arranged to redirect a plurality of millimeter waves to a focal plane overlapping with the plurality of second patches of the second patch array.

20. The dual-band radar of claim 18, further comprising:
a first substrate layer formed between the first plane and the second plane; and
a second substrate layer formed between the second plane and the third plane,
wherein the first plane is parallel to the second plane, and wherein the second plane is parallel to the third plane.

* * * * *